(12) United States Patent
Chu et al.

(10) Patent No.: US 9,984,940 B1
(45) Date of Patent: May 29, 2018

(54) SELECTIVE AND CONFORMAL PASSIVATION LAYER FOR 3D HIGH-MOBILITY CHANNEL DEVICES

(71) Applicants: International Business Machines Corporation, Armonk, NY (US); ULVAC, Inc., Kanagawa (JP)

(72) Inventors: Jack O. Chu, Manhasset Hills, NY (US); Stephen M. Gates, Ossining, NY (US); Masanobu Hatanaka, Yorktown Heights, NY (US); Vijay Narayanan, New York, NY (US); Deborah A. Neumayer, Danbury, CT (US); Yohei Ogawa, Yorktown Heights, NY (US); John Rozen, Hastings on Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 3 days.

(21) Appl. No.: 15/418,916

(22) Filed: Jan. 30, 2017

(51) Int. Cl.
*H01L 21/02* (2006.01)
*H01L 21/28* (2006.01)
(Continued)

(52) U.S. Cl.
CPC ........ *H01L 21/845* (2013.01); *H01L 21/0206* (2013.01); *H01L 21/02123* (2013.01);
(Continued)

(58) Field of Classification Search
CPC ......... H01L 21/02164; H01L 21/02323; H01L 29/785; H01L 21/02532; H01L 21/02271; H01L 21/02592
See application file for complete search history.

(56) References Cited

U.S. PATENT DOCUMENTS 7,436,034 B2  10/2008  Callegari et al.
7,678,633 B2   3/2010  Kwo et al.
(Continued)

FOREIGN PATENT DOCUMENTS

WO    WO2010140889 A1 * 12/2010 ........... C23C 16/513

OTHER PUBLICATIONS

Koveshnikov, S., et al., "Metal-oxide-semiconductor capacitors on GaAs with high-k gate oxide and amorphous silicon interface passivation layer", Applied Physics Letters, Jan. 2006, pp. 1-4, vol. 88, No. 2.

Ok, I., et al., "Metal Gate-HfO2 MOS Structures on GaAs Substrate With and Without Si Interlayer", IEEE Electron Device Letters, Mar. 2006, pp. 1-3, vol. 27, No. 3.
(Continued)

*Primary Examiner* — Caridad Everhart
(74) *Attorney, Agent, or Firm* — Fleit Gibbons Gutman Bongini Bianco PL; Jon A. Gibbons

(57) ABSTRACT

A scaled dielectric stack interlayer, compatible with subsequent high temperature processing with good electrical transport & reliability properties is provided. A method for forming a conformal aSi:H passivation layer on a semiconductor device is described. A patterned semiconductor wafer is placed in in a process chamber with a first layer formed thereon and a second layer formed thereon, the first layer and the second layer being two different materials Next, a $Si_xH_{(2x+2)}$ based deposition up to a temperature of 400 degrees Celsius is used on the first layer and the second layer thereby forming a conformal aSi:H passivating layer is formed at a higher rate of deposition on the first layer selectively and a lower rate of deposit on the second layer.

18 Claims, 8 Drawing Sheets

(51) Int. Cl.
*H01L 21/84* (2006.01)
*H01L 29/78* (2006.01)
*H01L 27/12* (2006.01)
*H01L 23/31* (2006.01)
*H01L 23/29* (2006.01)

(52) U.S. Cl.
CPC .. *H01L 21/02323* (2013.01); *H01L 21/02359* (2013.01); *H01L 21/28008* (2013.01); *H01L 23/298* (2013.01); *H01L 23/3171* (2013.01); *H01L 23/3192* (2013.01); *H01L 27/1211* (2013.01); *H01L 29/785* (2013.01); *H01L 21/0214* (2013.01); *H01L 21/02164* (2013.01); *H01L 21/02178* (2013.01); *H01L 21/02181* (2013.01); *H01L 21/02192* (2013.01); *H01L 21/28158* (2013.01); *H01L 21/28255* (2013.01); *H01L 21/28264* (2013.01)

(56) References Cited

U.S. PATENT DOCUMENTS

| | | | |
|---|---|---|---|
| 7,837,838 B2 | 11/2010 | Chua et al. | |
| 2002/0192914 A1* | 12/2002 | Kizilyalli | H01L 21/2257 438/300 |
| 2003/0022395 A1 | 1/2003 | Olds | |
| 2004/0033674 A1* | 2/2004 | Todd | H01L 21/0262 438/478 |
| 2004/0069991 A1 | 4/2004 | Dunn et al. | |
| 2015/0064912 A1* | 3/2015 | Jang | H01L 21/3086 438/696 |
| 2015/0340228 A1 | 11/2015 | Tapily et al. | |

OTHER PUBLICATIONS

Yokoyama, S., et al., "Self-limiting atomic-layer deposition of Si on SiO2 by alternate supply of Si2H6 and SiCl4", Applied Physics Letters, Jul. 30, 2001, pp. 1-4, vol. 79, No. 5.

Gong, X., et al., "Sub-400° C. Si2H6 Passivation, HfO2 Gate Dielectric, and Single TaN Metal Gate: A Common Gate Stack Technology for In0.7Ga0.3As and Ge1 -xSnx CMOS", IEEE Transactions on Electron Devices, May 2013, pp. 1-9, vol. 60, No. 5.

Hasunuma, E., et al., "Gas-phase-reaction-controlled atomic-layer-epitaxy of silicon", Journal of Vacuum Science & Technology A, Mar./Apr. 1998, pp. 1-7, vol. 16, No. 679.

Gong, X., et al., "Towards High Performance Ge1-xSnx and In0.7Ga0.3As CMOS: A Novel Common Gate Stack featuring Sub-400° C. Si2H6 Passivation, Single TaN Metal Gate, and Sub-1.3 nm EOT", Symposium on VLSI Technology Digest of Technical Papers, Jun. 12-14, 2012, pp. 1-2.

Chin, H., et al., "Strained In0.53Ga0.47As n-MOSFETs: Performance Boost with in-situ Doped Lattice-Mismatched Source/Drain Stressors and Interface Engineering", Symposium on VLSI Technology Digest of Technical Papers, Jun. 16-18, 2009, pp. 1-2.

El Kazzi, M., et al., "Thermally stable, sub-nanometer equivalent oxide thickness gate stack for gate-first In0.53Ga0.47As metal-oxide-semiconductor field-effect-transistors", Applied Physics Letters, Feb. 8, 2012, pp. 1-4, vol. 100, No. 063505.

Nishizaina, J., et al., "Surface reaction and selective growth investigation of temperature modulation Si molecular-layer epitaxy", Journal of Crystal Growth, Nov. 2001, pp. 1-11, vol. 233.

Lubben, D., et al., "Mechanisms and kinetics of Si atomic-layer epitaxy on Si(001)2x1 from Si2H6", Journal of Vacuum Science & Technology A, Nov./Dec. 1991, pp. 1-10, vol. 9, No. 6.

* cited by examiner

SELECTIVE AND CONFORMAL PASSIVATION LAYER FOR 3D HIGH-MOBILITY CHANNEL DEVICES

BACKGROUND OF THE INVENTION

The present invention relates to semiconductor devices, and more specifically, to the deposition of materials on high-mobility semiconductor layers.

Highly scaled device architecture such as FinFETs and Nanowires require a conformal high-quality gate stack to enable uniform electrostatic control. This is particularly challenging for the key interface layer of high mobility semiconductors such as InGaAs or (Si)Ge which possess low quality native oxides and have limited temperature process windows of up to 400 and 800 degrees Celsius, respectively, when their surfaces is exposed. In addition, monolithic CMOS integration with dual channels, e.g. InGaAs nFET & (Si)Ge pFET, generate complexity and limiting the number of process steps including lithography, masking, and etching by using deposition selectivity will reduce cost and increase yield.

SUMMARY OF THE INVENTION

In one embodiment, a process for forming a passivating conformal aSi:H interlayer is provided. Hydroginated amorphous silicon (aSi:H) is the non-crystalline form of silicon used for example in solar cells and thin-film transistors in LCD displays. The process uses a reaction-limited (higher order) silane-based ($Si_xH_{(2x+2)}$) deposition on high-mobility substrates below 400 degrees Celsius. This layer formation, in one example, is preceded by FIN compatible WETs process. For example, a FIN compatible WETs process is on InGaAs on InAlAs. The aSi:H process is followed by a nucleation layer for improved dielectric properties. The nucleation layer in one example is formed in-situ.

In one embodiment, the invention uses the slow Si—H bond cracking rate at temperatures up to 400 degrees Celsius. This makes the process reaction-limited instead of diffusion-limited as is the case with gas phase reactions. In addition, one or more embodiments use the self-limited nature of the surface-driven catalytic reaction yielding a deposition rate that slows proportionally with the already deposited aSi:H thicknesses. These factors combine to allow for very conformal films formed by a slow and self-controlled growth rate yielding even coating of 3D structures.

Due to the surface role in the reaction, the silicon deposits selectively on certain materials, and at different rates. For example, a dual gate stack with different channel materials can be implemented using simplified dual-gate stack schemes or self-aligned layer deposition.

According to one example of the present invention, a method for forming semiconductor device as part of a semiconductor integration sequence is provided. A patterned semiconductor wafer is placed in a process chamber with a first layer formed thereon and a second layer formed thereon, the first layer and the second layer being two different materials which exposed surfaces cover distinct regions of the wafer.

Next a SixH(2x+2) based deposition process up to a temperature of 400 degrees Celsius is applied on the first layer, and the second layer thereby forming a conformal aSi:H passivating layer at a higher rate of deposition on the first layer selectively and a lower rate of deposit on the second layer.

According to another example of the present invention, a method for forming a conformal aSi:H passivation layer on a semiconductor device is provided. A high-mobility semiconductor layer is placed in a process chamber. Typically, the high-mobility semiconductor layer is indium gallium arsenide (InGaAs), silicon-germanium (SiGe), germanium (Ge), silicon (Si), a type III-V material, or low quality native oxides. The high-mobility layer includes nanowires, nanosheets, gate all around devices, FIN, vertical FET or any such 2D or 3D channel devices.

Next, a $Si_xH_{(2x+2)}$ based process up to a temperature of 400 degrees Celsius is applied to the high-mobility semiconductor layer. A conformal aSi:H passivating layer is formed on the high-mobility semiconductor layer. In another example, the conformal aSi:H passivating layer is formed selectively. In another example, a semiconductor device is formed using this process.

Additional features and advantages are realized through the techniques of the present invention. Other embodiments and aspects of the invention are described in detail herein and are considered a part of the claimed invention. For a better understanding of the invention with the advantages and the features, refer to the description and to the drawings

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
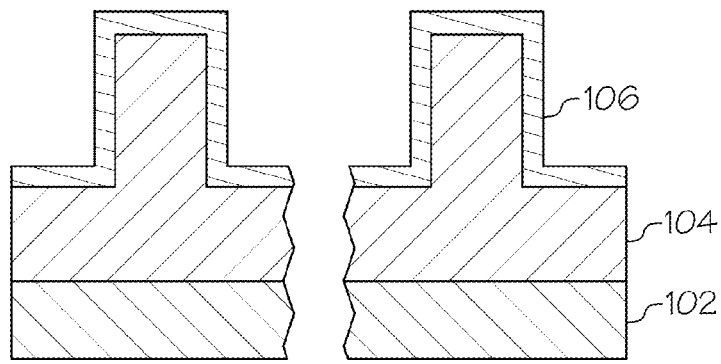
FIG. 1 illustrates a side view of a substrate with FIN channels being exposed to a $Si_xH_{(2x+2)}$ based process up to a temperature of 400 degrees Celsius, according to one embodiment of the invention.

It is to be understood that the present invention will be described in terms of a given illustrative example process for surface conditioning of semiconductor interfaces, junctions, and contacts. However, other semiconductor architectures, structures, substrate materials, and process features and steps can be varied within the scope of the present invention.

The present invention provides a scaled dielectric stack interlayer, compatible with subsequent high temperature processing with good electrical transport & reliability properties.

Non-Limiting Definitions

The terms "a", "an" and "the" preceding an element or component are intended to include the plural forms as well, unless the context clearly indicates otherwise.

The terms "comprises", "comprising", "includes", "including", "has", "having" "contains" or "containing" or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

"Conformal" means equal the thickness in field on the edges of high aspect ratio structures. Compatible, Nanowires, Nano-sheets, FIN, vertical FET or any such 2D or 3D channel devices all around devices even more demanding conformality devices.

The term "ex-situ" is used to mean the process occurs while the semiconductor being formed is removed from a process chamber used in the previous process step.

The term "in-situ" is used to mean the process occurs while the semiconductor product being form is a process chamber from the previous process step.

As used herein, the terms "invention" or "present invention" are non-limiting terms and not intended to refer to any single aspect of the particular invention but encompass all possible aspects as described in the specification and the claims.

"Selective" means a deposition rate is different from surface of material A to surface of material B.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The term "III-V semiconductor material" denotes a semiconductor material that includes at least one element from Group IIIB of the Periodic Table of Elements under the Old International Union of Pure and Applied Chemistry (IUPAC) classification system, or Group 13 of the New International Union of Pure and Applied Chemistry classification system; and at least one element from Group VB of the Periodic Table of Elements, or Group 15 of the New International Union of Pure and Applied Chemistry classification system. In some embodiments, the III-V semiconductor material that provides the III-V semiconductor substrate 1 can be selected from the group of (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof.

Formation of Conformal aSi:H Passivation Layer

FIG. 1 illustrates a side view of a gate stack structure formation on a substrate 102. The substrate 102 includes, for example, a bulk silicon, a silicon germanium, germanium, a high mobility III-V material such as, InGaAs, GaAs, InAs, InAlAs, a wide band gap material such as, SiC or GaN, or an insulator material such as an oxide material. The substrate can be composed of a bulk material on which necessary intermediate or buffer layers were formed for channel isolation and/or epitaxial growth. In the illustrated embodiment, the substrate 102 includes a semiconductor material. A high-mobility semiconductor with active channel regions 104 is formed on the substrate 102. The high-mobility layer 104 includes, for example, silicon germanium, germanium, or a III-V material.

Optionally, the high-mobility semiconductor layer 104 is cleaned with a FIN compatible WET process. The WET process can be any of a buffered oxide etch (BOE) solution, a hydrogen fluoride (HF) solution, a hydrochloric acid (HCl) solution, a ammonium hydroxide (NH4OH) or a (NH4)2S solution prior to forming the conformal aSi:H passivating layer thereon.

Optionally, the high-mobility semiconductor layer 104 is treated with a FIN compatible plasma process in-situ with the following thin film deposition, using a reducing, and/or sulfur containing gas or gas mixture.

Next, a $Si_xH_{(2x+2)}$ based deposition up to a temperature of 400 degrees Celsius is applied on the high-mobility semiconductor layer thereby forming a conformal hydrogen containing amorphous silicon (aSi:H) passivating layer 106 thereon. This can be performed in-situ within the tool following a gas-based cleaned. Examples of deposition includes chemical vapor deposition (CVD) process, a plasma-enhanced chemical vapor deposition (PECVD) process, remote plasma chemical vapor deposition (RPCVD), hot-wire chemical vapor deposition (HWCVD), atomic layer deposition (ALD), plasma-enhanced atomic layer deposition (PEALD), molecular beam epitaxy, of e-beam deposition. In one example, the selective Si—H dissociation process is a thermal CVD process on InGaAs with demonstrated growth rate of ~1 A/min in the initial stage.

Figure 2:
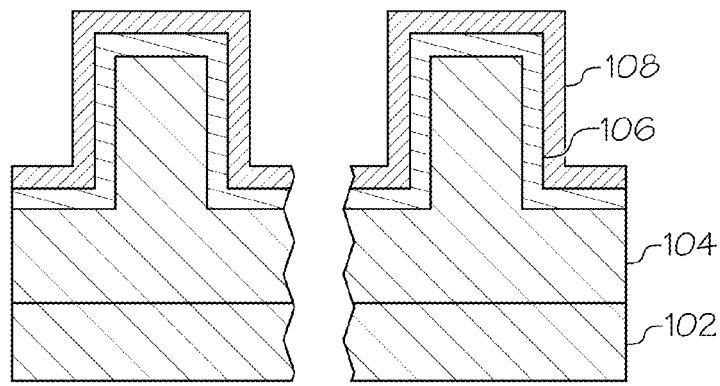
FIG. 2 illustrates the formation of a nucleation layer on the conformal aSi:H passivation layer of FIG. 1, according to one embodiment of the invention.

The aSi:H passivating layer 106 is followed by a nucleation layer 108 for improved dielectric properties. With heavily hydrogenated silicon, it is difficult, especially using ALD, to grow a subsequent layer on the hydrophobic H-terminated surface. The nucleation layer helps with this process through oxidation. A description of forming this nucleation layer is described in the co-pending U.S. patent application entitled "Activated Thin Silicon Layers", with application Ser. No. 14/868,413, filed on Sep. 29, 2015, the teachings of which is hereby incorporated by reference in its entirety. In the nucleation layer 108 in one example is formed in-situ. FIG. 2 illustrates the formation of a nucleation layer on the conformal hydrogenated amorphous silicon (aSi:H) passivation layer of FIG. 1.

Figure 3:
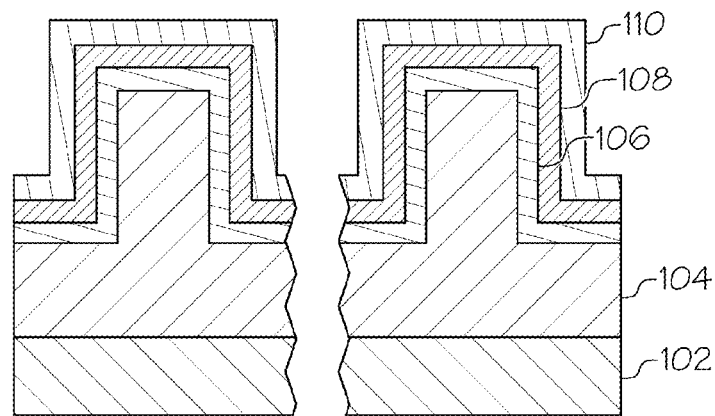
FIG. 3 illustrates deposition of a conformal dielectric material, according to one embodiment of the invention.

FIG. 3 illustrates a conformal for high-k dielectric material deposition 110 after the nucleation layer 108 is formed in FIG. 2. The dielectric layer 110 is formed by, for example, an ALD process. The dielectric layer 110 includes, for example, $SiO_2$, $HfO_3$, $Si_3N_4$, SiON, $La_2O_3$, or $Al_2O_3$. The nucleation layer 108 provides a hydrophilic surface that allows the dielectric layer 110 to be deposited uniformly without an incubation delay prior to depositing the dielectric layer 110.

Use of Process Selectivity in Device Integration

The selectivity of the amorphous silicon (aSi:H) process can be taken advantage of during the integration. Specifically, this process described with reference to FIGS. 1-3 can be applied to FET and CMOS integration. The reaction-limited nature of the deposition process using $SixH(2x+2)$ is thought to be related to the breaking of Si—H bonds at the surface and the release of hydrogen in the gas phase which allows for the next Si-containing molecule to stick to surface at a given site. The release of hydrogen being surface mediated, it can occur at different rates depending on the material, allowing for selectivity of the deposition. For example, hydrogen atoms can desorb from Ga-containing surfaces by forming $H_2$ molecules below 400 C due to its higher diffusion rate when compared to Silicon-containing surfaces. Methods are designed to achieve complex structures by taking advantage of the different deposition rate of the aSi:H material on different starting surfaces. In particular, in CMOS technology it can be used as part of a self-aligned fabrication scheme as the thickness of aSi:H can be made significantly thinner, or non-existent, in designated regions of the patterned substrate wafer, based on the existing under-layer. If unwanted aSi:H is to be removed from the regions where it is thinnest by design, a wet or dry etch process can be used without an additional lithography step. For example, a wet etch that can be used to remove aSi:H is the succession of hydrogen peroxide (to oxidize it) and an HF-containing solution; if the chemicals are diluted enough, selective removal is enabled by adjusting the etch time to the etch rate so that aSi:H remains only where it was thicker in the first place. The overall reduction in number of lithography alignment steps by use of such self-aligned methods can benefit complex CMOS integration, allowing increased yield at increased device definition, i.e. density. Examples of this are given in following sections using the different starting surfaces in dual gate stacks and/or in channel regions versus source/drain.

FET Device Integration Embodiment

An example of the selective integration scheme described above is with reference to FIG. 4A-4E illustrates the formation of a field effect transistor (FET) device 400 on insulating box or dielectric layer 402, such as silicon oxide or InAlAs. The channel regions 404 is used in a variety of semiconductor devices such as, for example, planar or three-dimensional FETs, including FINs, nanowires, nanosheets, vertical FET with even more demanding conformality requirements. The gate stack atop 404, comprising dielectric and metal deposition, is formed using a gate-first or gate-last scheme.

Due to selective process, the dielectric aSi:H passivation layer 406 is not formed on the dielectric layer 402 and is only deposited on the channel region 404 as shown due to the catalytic effect of the surface. The area between the two gates 404 does not need to be reopened. Next, a nucleation layer 408 and a conformal for high-k dielectric material deposition 410 after the nucleation layer 408 is deposited. For example, the channel regions are made of InGaAs that result in a higher deposition rate of aSi:H when compared to an InAlAs box/buffer due the presence of Ga. In general, the aSi:H might be deposited somewhat in the field but since it occurs at a lower rate due the presence of a different material, it can be removed more easily than in the channel regions using a given etching process without the need for an additional lithography step.

Figure 4A:
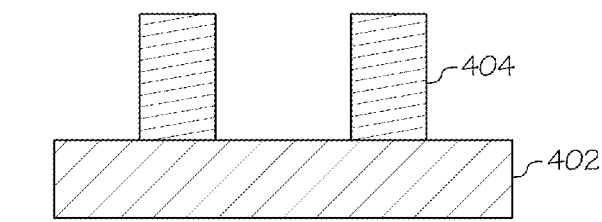
FIG. 4A-4E illustrates the formation of a field effect transistor (FET) device on insulating box, according to one embodiment of the invention.
Figure 4D:
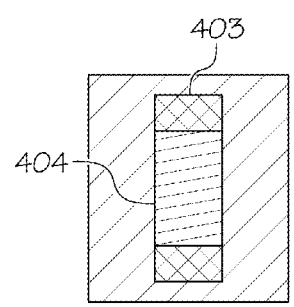
Figure 4B:
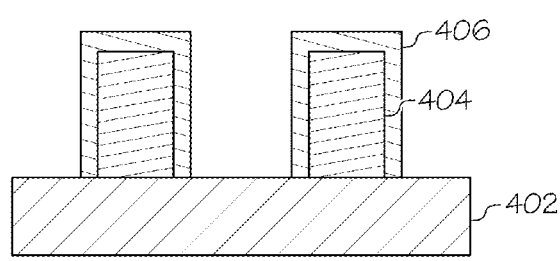
Figure 4C:
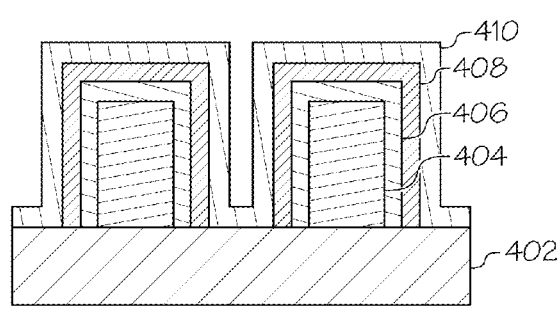
Figure 4E:
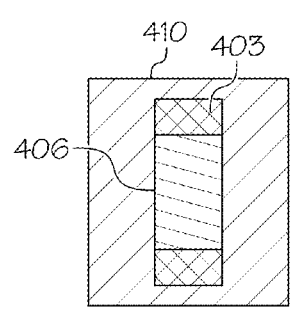

FIGS. 4D and 4E illustrate the presence of defined source/drain regions 403. If a different material is present on such regions during $SixH(2x+2)$ based passivation 406 on the active area, it will reduce the etching budget to remove the aSi:H layer from the contacts as its thickness will be less, enabling reduced integration complexity and risk for increased contact resistance. For example, in a gate-last scheme on InGaAs channels, $Al_2O_3$ can be used to mask the source/drain regions, and optionally the field, so that aSi:H removal in those area does not generate a risk of undercut and short under the gate.

CMOS Device Integration Embodiment

Figure 5A:
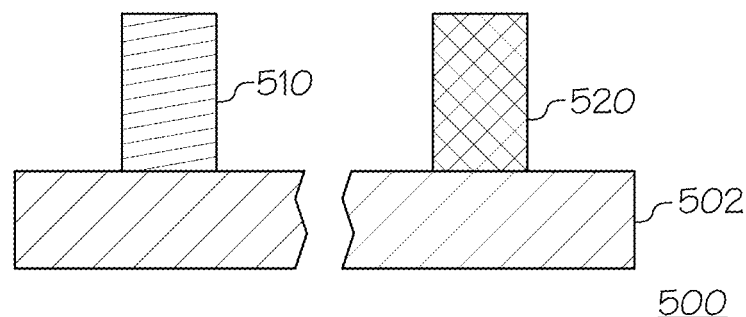
FIG. 5A-5C illustrates the formation of a dual gate stack, according to one embodiment of the invention.
Figure 5B:
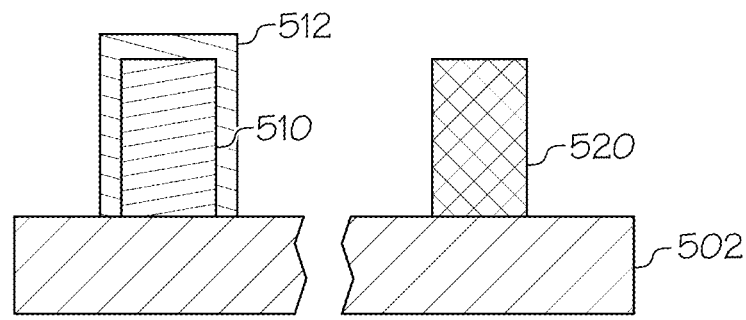
Figure 5C:
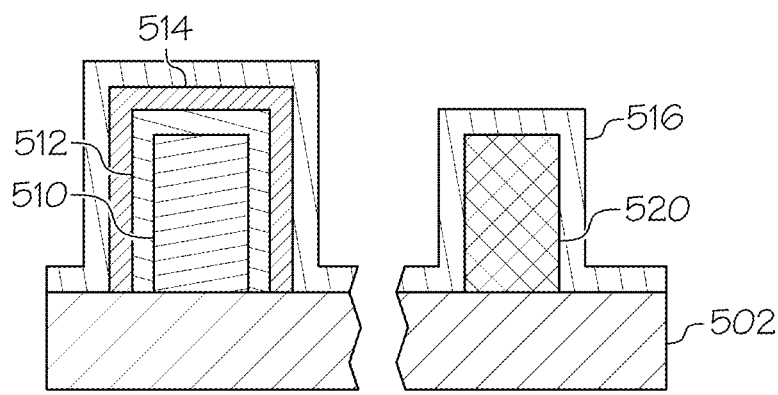

FIG. 5A-5C illustrates the formation of a dual gate stack. Shown are two different types of channel material 510, 520 formed on the substrate 502 which might include a buffer layer. Examples of two different active channel materials 510, 520 are p-SiGe and n-Si. Due to selective process of two different channel materials, the aSi:H passivation layer 512 is preferentially formed on one stack 510 of the two stacks 510 and 520 due to the catalytic effect of the surface. As in the previous example, a nucleation layer 514 and a conformal for high-k dielectric material deposition 516 after the nucleation layer 514 is deposited. This shows selectively deposit amorphous silicon on only one of the two different active channel types, 510, 520. In this scheme a dual gate-stack is formed as part of a CMOS scheme using the selectivity of the aSi:H between the n-FET and p-FET semiconductor channel materials. In general, aSi:H might be deposited at different rates on the two polarities of the CMOS channel regions which will prevent shorts between devices and allow for self-aligned etching of the aSi:H layer due to relative difference in thicknesses. For example, a wet etch to be used to remove aSi:H is the succession of hydrogen peroxide (to oxidize it) and an HF-containing solution; if the chemicals are diluted enough, selective removal is enabled by adjusting the etch time to the etch rate so that aSi:H remains only where it was thicker in the first place.

High-Mobility Dual Stack Integration Embodiment

Figure 10A:
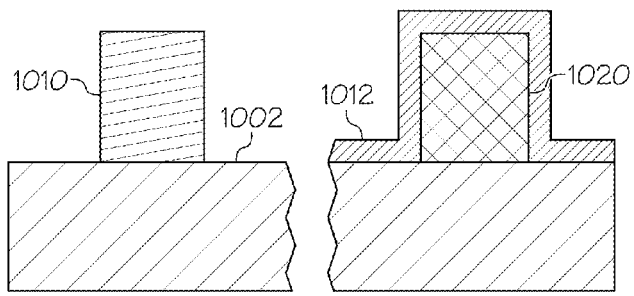
FIG. 10A-D illustrates the formation of a dual gate stack on high mobility channel materials, according to one embodiment of the invention.
Figure 10B:
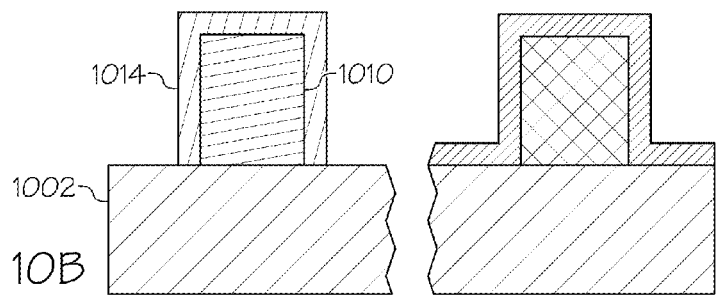
Figure 10C:
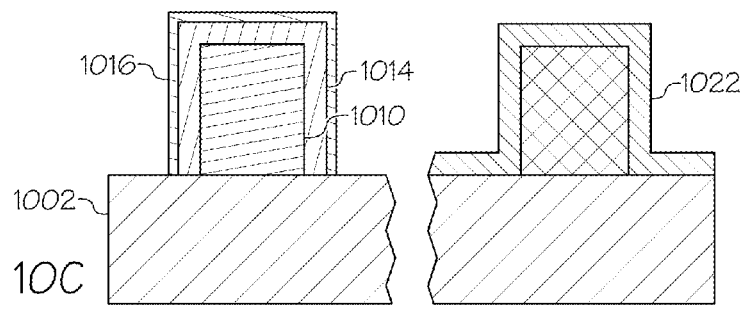
Figure 10D:
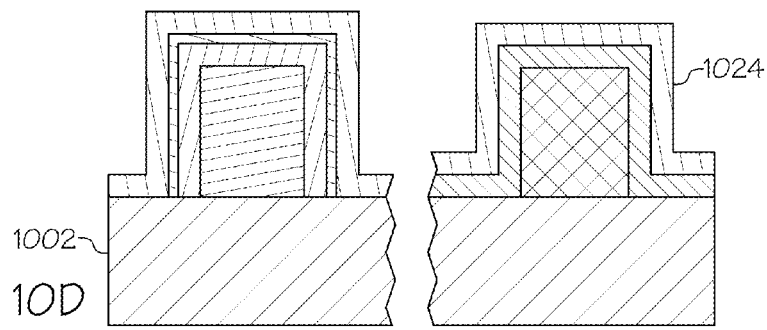

FIG. 10A-D illustrates the formation of a dual gate stack on high mobility channel materials. Shown in FIG. 10A are two different types of channel material 1010, 1020 formed on the substrate 1002 which might include a buffer layer and/or an insulator. The two different active channel materials 1010 and 1020 are n-type III-V such as InGaAs and p-type Ge or SiGe, respectively. A thin film 1012 of up to 20 A of conformal $Al_2O_3$ is present primarily only on the p-FET region as seen in FIG. 10A. The film can be deposited by atomic layer deposition (ALD) at temperatures below 400 C using alternating chemistry such as tri-methyl aluminum (TMA) and water ($H_2O$). The structure of FIG. 10A can be obtained by either depositing the $Al_2O_3$ thin film layer on both polarity FETs followed by masking of the p-FET for selective removal of $Al_2O_3$ on the n-FET by wet chemistry, such as diluted buffered oxide etch (BOE), or the structure of FIG. 10A can be obtained by removing the dummy gate on the p-FET only prior to $Al_2O_3$ deposition, followed by dummy gate removal on the n-FET in a replacement gate flow. FIG. 10B illustrates the structure resulting from the subsequent deposition of aSi:H film, 1014 with both polarity exposed, it can be up to 20 A. The higher growth rate of the film on the n-FET region 1010 when compared to the rate on $Al_2O_3$ 1012, allows for selective deposition resulting in no deposition on 1012 or in a much thinner film that can be removed from 1012 using diluted chemistry, such as hydrogen peroxide in water followed by diluted HF or buffered oxide etch, leaving the bulk of the film intact 1014 on the 1010 n-FET InGaAs FIN. The subsequent exposure of the dual stack in an oxidizing ambient results in modification of the p-FET stack, with benefit such as gate leakage reduction, as described in the co-pending U.S. patent application entitled "Structures And Methods For Equivalent Oxide Thickness Scaling On Silicon Germanium Channel Or III-V Channel Of Semiconductor Device", with application Ser. No. 15/133,656, filed on Apr. 20, 2016, and in the formation of a thin hydrophilic nucleation oxide layer 1016 on 1014 on the n-FET stack as described in the co-pending U.S. patent application entitled "Activated Thin Silicon Layers", with application Ser. No. 14/868,413, filed on Sep. 29, 2015, the teachings of which is hereby incorporated by reference in its entirety. Also the thin film 1012 of conformal $Al_2O_3$ is modified by this oxidizing step as described in the above-mentioned incorporated patent applications. This is illustrated as 1022 in FIG. 10C. Finally, a common conformal 1024 $HfO_2$ layer of 10 to 50 A is deposited by ALD at temperatures below 400 C, using alternating chemistry such as $HfCl_4$ and $H_2O$ as shown in FIG. 10D. In this embodiment a dual gate-stack is formed as part of a CMOS integration sequence using the selectivity of the aSi:H deposition on $Al_2O_3$ and the Ga-containing n-FET channel InGaAs.

Experimental Results

Figure 6:
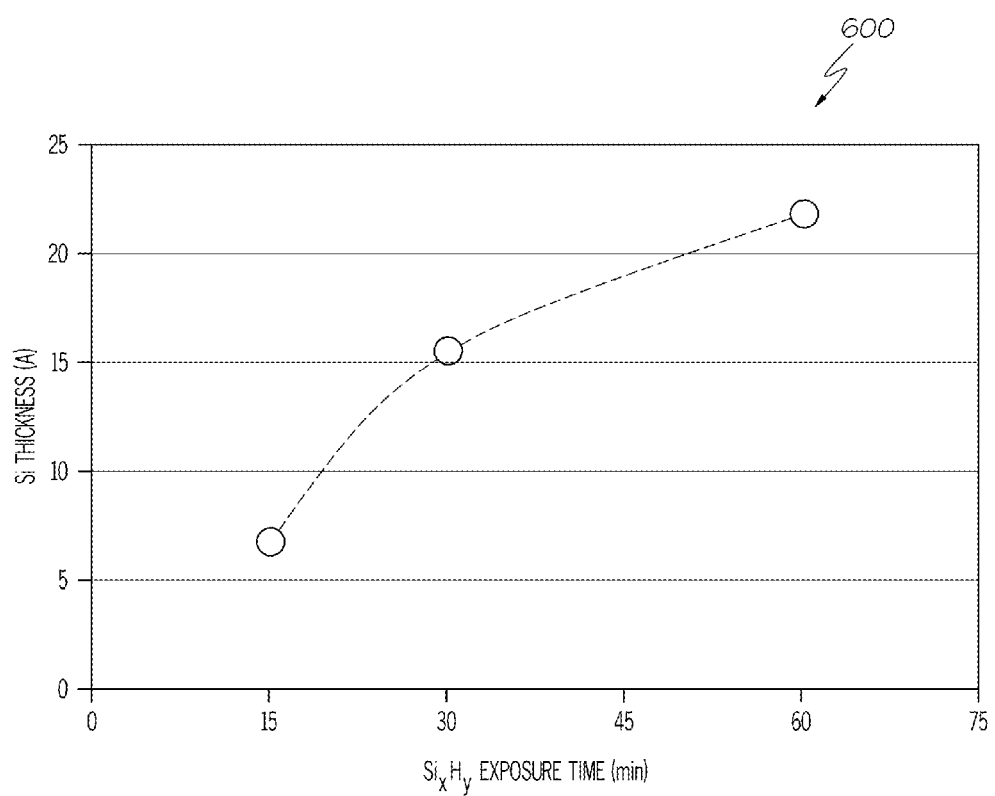
FIG. 6 is a graph showing measured silicon thickness over exposure time, according to one embodiment of the invention.

FIG. 6 is a graph showing measured aSi:H thickness by medium energy ion scattering (MEIS) as a function of $Si_xH_y$ exposure time on a Ga-containing surface. The graph shows thickness of aSi:H passivating layer over time using a CVD $Si_xH_y$ based deposition up to a temperature of 400 degrees Celsius. On InGaAs, deposition of aSi:H is understood to be due to surface catalytic effect. As the deposited film becomes thicker, the rate drops as it is approaching bulk-like properties on which deposition does not occur due to H-termination.

Figure 7:
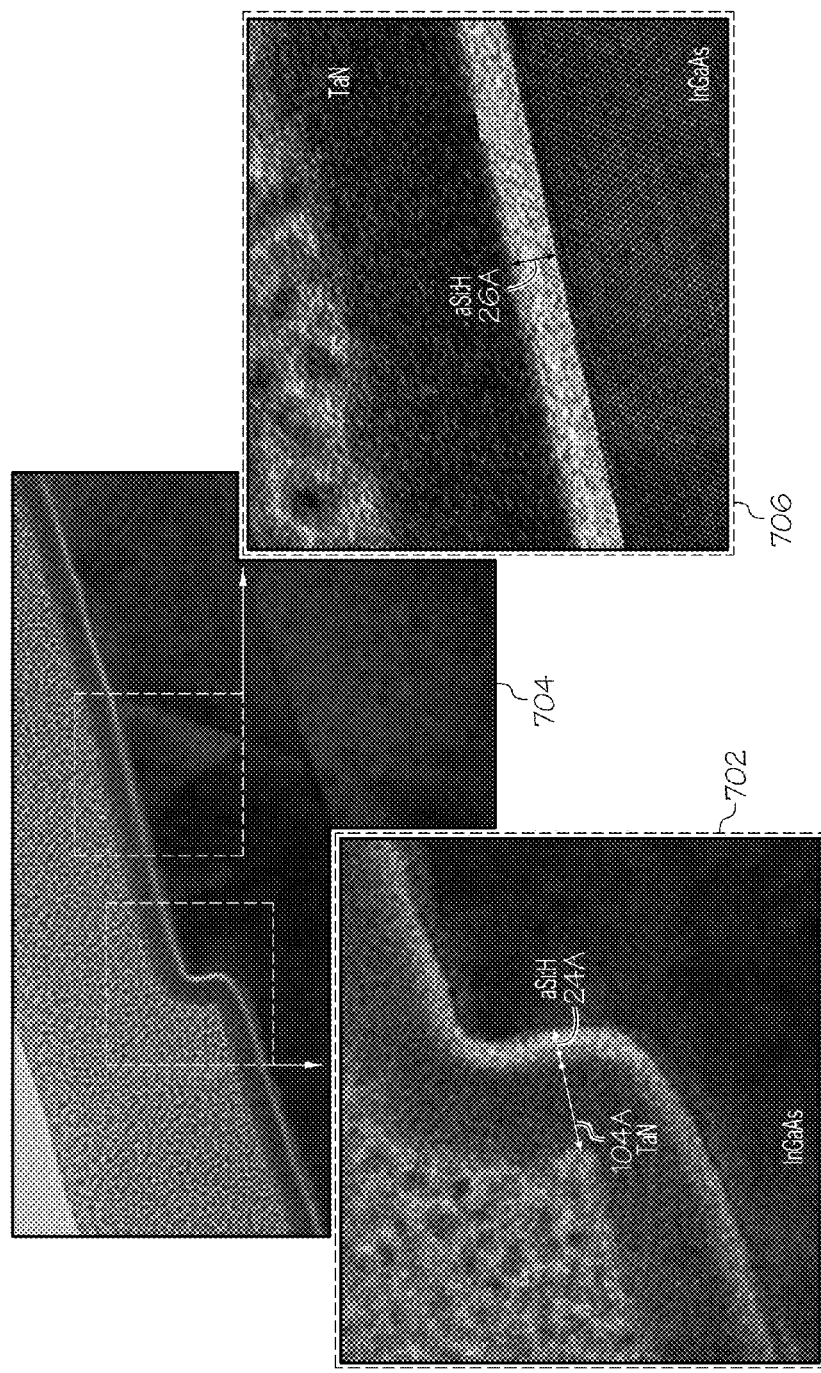
FIG. 7 illustrates a photo of cross-section of a InGaAs device with $Si_xH_{(2x+2)}$ based deposition, according to one embodiment of the invention.

FIG. 7 is a cross-section taken by tunneling electron microscopy (TEM) of a 3D InGaAs device with $Si_xH_{(2x+2)}$ based deposition showing a highly conformal aSi:H layer. More specifically image 702 shows an enlarged view of a right rectangular region in 704 of an edge with a 24-Angstrom thickness of aSi:H. Whereas image 706 is an enlarged view of left rectangular region in 704 measured as 26-Angstrom thickness of aSi:H in the field. The conformality is understood to be associated with the reaction-limited deposition allowing for the gas species to diffuse around high-aspect ratios features.

Figure 8:
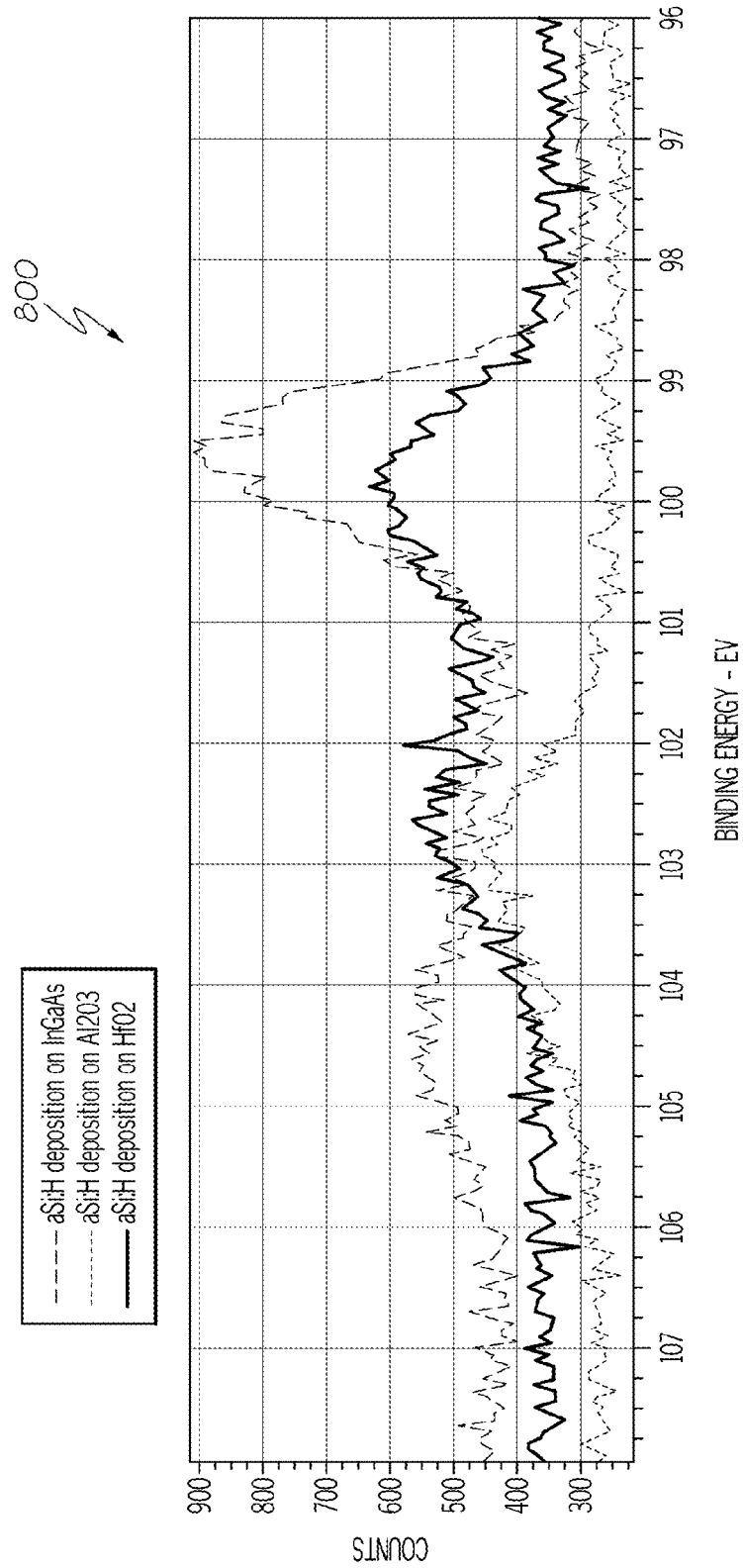
FIG. 8 is a graph showing binding energy and relative Si signal intensity, indicative of thickness, following aSi:H deposition on different materials, according to one embodiment of the invention.

FIG. 8 is a graph showing x-ray photoelectron spectroscopy (XPS) signal count related to Si atoms as a function of binding energy following equivalent aSi:H deposition on three different materials InGaAs, Al2O3, HfO2 using the same deposition parameters. The integrated peak ratios demonstrate progressively higher deposition rate on Al2O3, HfO2, and InGaAs, respectively. This rate difference can be used in integration schemes where, for example, an Al2O3 mask is deposited where aSi:H thickness is desired to be lower than on exposed InGaAs, so that it can subsequently be removed by wet or dry etch processes.

Flow Diagram

Figure 9:
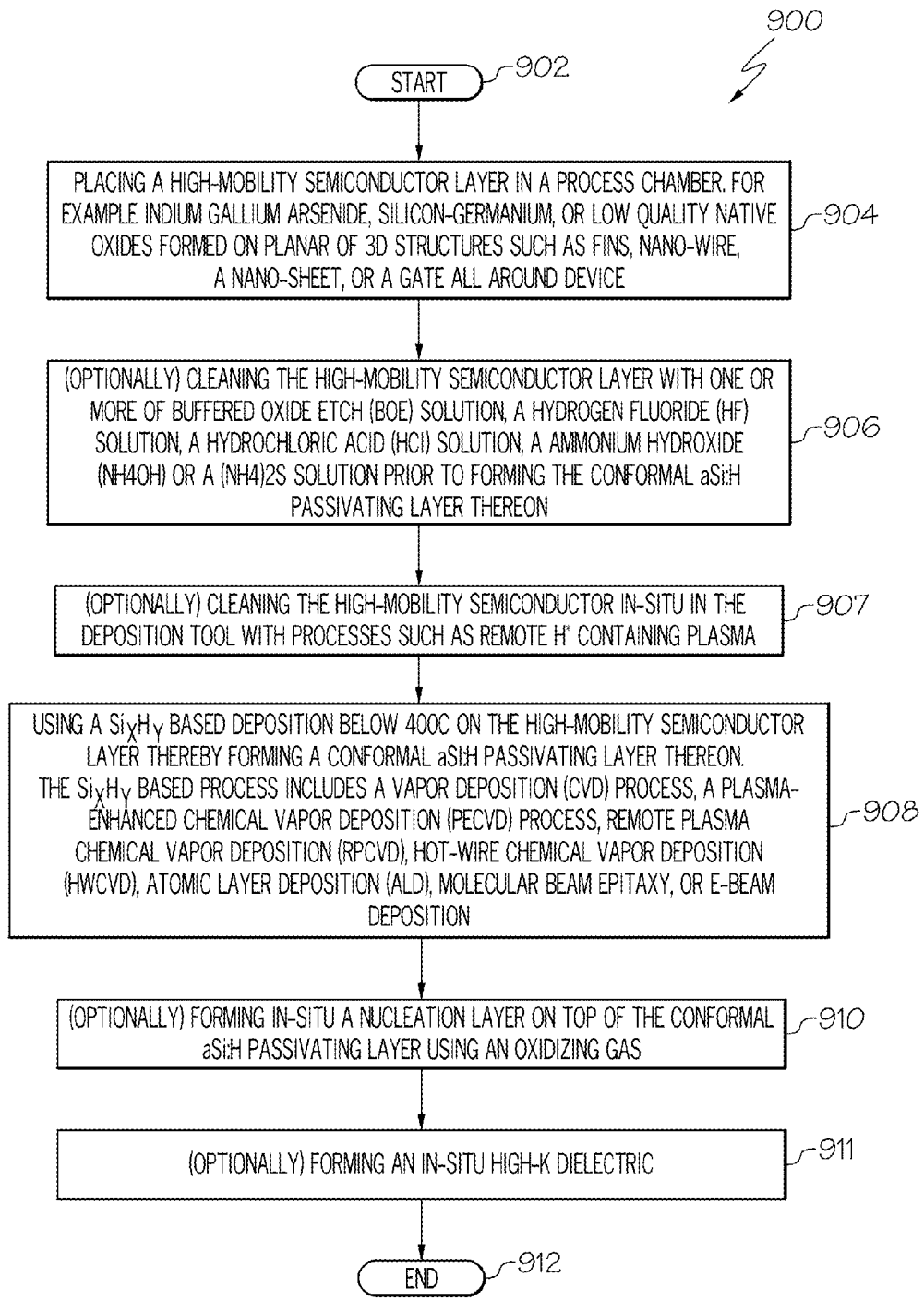
FIG. 9 illustrates is a flow diagram of one process for formation of a aSi:H passivating layer, according to one embodiment of the invention.

FIG. 9 is an operational flow diagram illustrating one process for forming a semiconductor structure comprising a aSi:H passivating layer. In FIG. 9, the operational flow diagram begins at step 902 and flows directly to step 904. It should be noted that each of the steps shown in FIG. 11 have been discussed above with respect to FIGS. 1-8. In step 904, a high-mobility semiconductor layer in a process chamber. for example indium gallium arsenide, silicon-germanium, or low quality native oxides formed on planar of 2D or 3D structures, such as, a nanowire, a nanosheet, FIN, vertical FET, or a gate all around device.

Next step 906 is an optional step. The high-mobility semiconductor layer with one or more of buffered oxide etch (BOE) solution, a hydrogen fluoride (HF) solution, a hydrochloric acid (HCl) solution, a ammonium hydroxide (NH4OH) or a (NH4)2S solution prior to forming the conformal aSI:H passivating layer thereon.

An optional step 907 cleaning the high-mobility semiconductor in-situ in the deposition tool with processes such as remote H* containing plasma.

In step 908, a aSi:H and $Si_xH_{(2x+2)}$. deposition process up to a temperature of 400 degrees Celsius is used on the high-mobility semiconductor layer thereby forming a conformal aSI:H passivating layer thereon. The $Si_xH_y$ based process includes a vapor deposition (CVD) process, a plasma-enhanced chemical vapor deposition (PECVD) process, remote plasma chemical vapor deposition (RPCVD), hot-wire chemical vapor deposition (HWCVD), atomic layer deposition (ALD), molecular beam epitaxy, or E-beam deposition Step 910 is optional. An in-situ nucleation layer on top of the conformal aSI:H passivating layer using an oxidizing gas is formed.

In step 911, forming an in-situ high-k dielectric is optional.

The process flow exits at step 912.

Generalized Semiconductor Design

The present examples can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used as part of a process in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

Various embodiments of the present invention includes in-situ sequential use of atomically controlled layer etching (aka Atomic Layer Etching—ALE, molecular layer etching, digital etching, layer-by-layer etching) not for patterning but as a surface conditioning method to remove or clean a semiconductor interface layer prior to dielectric gate stack or metal contact formation.

Non-Limiting Examples

In each of the embodiments described above, a silicon layer having an H-terminated surface is formed and processed to form a seed layer having hydrophilic properties that is conducive to depositing layers of oxide materials having uniform thickness without incurring an incubation delay prior to depositing the oxide layer.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There can be many variations to this diagram or the steps (or operations) described therein without departing from the spirit of the invention. For instance, the steps can be performed in a differing order or steps can be added, deleted or modified. All of these variations are considered a part of the claimed invention.

Although specific embodiments of the present invention have been disclosed, those having ordinary skill in the art will understand that changes can be made to the specific embodiments without departing from the spirit and scope of the present invention. The scope of the present invention is not to be restricted, therefore, to the specific embodiments, and it is intended that the appended claims cover any and all such applications, modifications, and embodiments within the scope of the present invention.

What is claimed is:

1. A method for forming semiconductor device as part of a semiconductor integration sequence, the method comprising:
   placing a patterned semiconductor wafer in a process chamber with a first layer formed thereon and a second layer formed thereon, the first layer and the second layer being two different materials which exposed surfaces cover distinct regions of the patterned semiconductor wafer;
   applying a $Si_xH_{(2x+2)}$ based deposition up to a temperature of 400 degrees Celsius on the, the first layer, and the second layer thereby forming a conformal aSi:H passivating layer at a higher rate of deposition on the first layer selectively and a lower rate of deposit on the second layer; and
   wherein the first layer is formed as a first active channel semiconductor material and the second layer is formed as a second active semiconductor channel material, the first active semiconductor channel material and the second active semiconductor channel material being two different polarities.

2. The method of claim 1, further comprising:
   forming a thin film of conformal $Al_2O_3$ on the second active semiconductor channel material prior to applying a $Si_xH_{(2x+2)}$ based deposition.

3. The method of claim 1, further comprising:
   removing any conformal aSi:H passivating layer formed on the second layer using diluted chemistry or reactive-ion etching (RIE).

4. The method of claim 1, further comprising:
   applying a $HfO_2$ based deposition up to a temperature of 400 degrees Celsius on the conformal aSi:H passivating layer and the second layer thereby forming a conformal $HfO_2$ layer thereon.

5. The method of claim 1, further comprising:
   forming a hydrophilic seed layer on the conformal aSi:H passivating layer and the second layer; and
   depositing an oxide material layer on the hydrophilic seed layer.

6. The method of claim 1, wherein the first active semiconductor channel material is one or more of a planar, a FIN, a vertical FET, a nanowire, a nanosheet, 2D or 3D channel structures, or a gate all around device.

7. The method of claim 1, wherein the first active semiconductor channel material is a layer forming at least one or more of III-V compounds including indium gallium arsenide (InGaAs), silicon-germanium (SiGe), or low quality native oxides.

8. The method of claim 1, wherein the $Si_xH_{(2x+2)}$ based deposition is one or more of chemical vapor deposition (CVD) process, a plasma-enhanced chemical vapor deposition (PECVD) process, a remote plasma chemical vapor deposition (RPCVD), hot-wire chemical vapor deposition (HWCVD), atomic layer deposition (ALD), plasma-enhanced atomic layer deposition (PEALD), molecular beam epitaxy, of e-beam deposition.

9. The method of claim 1, further comprising:
   cleaning the high-mobility semiconductor layer with one or more of buffered oxide etch (BOE) solution, a hydrogen fluoride (HF) solution, a hydrochloric acid (HCl) solution, a ammonium hydroxide ($NH_4OH$) or a $(NH_4)_2S$ solution prior to forming the conformal aSi:H passivating layer thereon.

10. The method of claim 1, further comprising:
forming in-situ a nucleation layer on top of the conformal aSi:H passivating layer using an oxidizing gas.

11. The method of claim 1, further comprising:
forming ex-situ a nucleation layer on top of the conformal aSi:H passivating layer by exposure to at least one of air or wet oxidation chemistry.

12. The method of claim 1, further comprising:
forming a conformal dielectric layer on top of the conformal aSi:H passivating layer on the conformal dielectric layer includes one or more of SiO2, HfO2, Si3N4, SiON, La2O3, or Al2O3.

13. The method of claim 1, further comprising:
forming an insulating box; and
wherein the placing the patterned semiconductor wafer includes placing a high-mobility semiconductor layer in the process chamber is a FinFET (Fin Field Effect Transistor), and
wherein the applying the $Si_xH_{(2x+2)}$ based deposition on the high-mobility semiconductor layer thereby forming the conformal aSi:H passivating layer selectively at a higher rate of deposition on the FinFET and a lower rate of deposit on the insulating box.

14. The method of claim 12, further comprising the conformal dielectric layer in-situ.

15. The method of claim 12,
wherein the applying the $Si_xH_{(2x+2)}$ based deposition on the patterned semiconductor wafer includes applying the $Si_xH_{(2x+2)}$ based deposition on high-mobility semiconductor layers thereby forming the conformal aSi:H passivating layer is not formed on a dielectric layer and only deposited in a channel region of and the high-mobility semiconductor layer.

16. A semiconductor device comprising:
a patterned semiconductor wafer;
first layer formed on a first portion of the patterned semiconductor wafer;
a second layer formed on a second portion of the patterned semiconductor wafer, the first portion and the second portion being two distinct regions of the patterned semiconductor wafer; and
a Si:H passivating layer formed at a higher rate of deposition on the first layer selectively and a lower rate of deposit on the second layer using a SixH(2x+2) based deposition up to a temperature of 400 degrees Celsius on the first layer, and the second layer, wherein the first layer is an first active channel semiconductor material and the second layer is formed as a second active semiconductor channel material, the first active semiconductor channel material and the second active semiconductor channel material being two different polarities.

17. The semiconductor device of claim 16, further comprising:
a thin film of conformal Al2O3 formed on the second active semiconductor channel material prior to applying a SixH(2x+2) based deposition.

18. The semiconductor device of claim 16, wherein the first active semiconductor channel material is one or more of a planar, a FIN, a vertical FET, a nanowire, a nanosheet, 2D or 3D channel structures, or a gate all around device.

* * * * *